(12) United States Patent
Ivan (10) Patent No.: US 6,194,652 B1
(45) Date of Patent: Feb. 27, 2001

(54) CABLE TERMINATING CONNECTORS

(75) Inventor: William John Ivan, Woodbridge, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/261,292

(22) Filed: Mar. 2, 1999

(51) Int. Cl.$^7$ .................................................. H01B 11/02
(52) U.S. Cl. ............................................................. 174/33
(58) Field of Search ............................ 174/33, 261, 251, 174/34, 79

(56) References Cited

U.S. PATENT DOCUMENTS

| | | | |
|---|---|---|---|
| 2,667,543 | * | 1/1954 | Smith et al. ............................ 174/78 |
| 4,131,933 | * | 12/1978 | Agard et al. .......................... 361/415 |
| 4,777,325 | * | 10/1988 | Siwinski ................................ 174/34 |
| 4,918,258 | * | 4/1990 | Ayer ....................................... 174/53 |
| 5,326,934 | * | 7/1994 | LeMaster et al. ..................... 174/59 |
| 5,424,490 | * | 6/1995 | Dombrowski et al. ............... 174/33 |
| 5,426,738 | * | 6/1995 | Hsieh et al. .......................... 395/275 |
| 5,532,429 | * | 7/1996 | Dickerson et al. .................... 174/36 |
| 5,964,609 | * | 10/1999 | Wilson et al. ........................ 439/215 |
| 6,045,389 | * | 4/2000 | Ferrill et al. ......................... 439/398 |

* cited by examiner

*Primary Examiner*—Kristine Kincaid
*Assistant Examiner*—William H Mayo, III
(74) *Attorney, Agent, or Firm*—Michael Y. Epstein; Henry I. Schanzer

(57) ABSTRACT

This invention deals with a method of assembling first and second connectors at the ends of a cable including twisted pairs of color encoded wires, first ends of two wires of one of the twisted wire pairs are connected, preferably at random, to a dedicated pair of tip and ring contacts of the first connector. The second ends of the two wires of the one wire pair are connected, at random, to two intermediate contacts of the second connector. Each intermediate contact is connected by a pair of conductive paths to both of the tip and ring contacts of the second connector dedicated to the one wire pair. Afterwards, in reliance upon a visual determination of how the two wires are actually connected to the tip and ring contacts of the first connector and to the intermediate contacts of the second connector, one conductive path from each of the intermediate contacts is opened for exclusively interconnecting, via the two wires of the one wire pair, the tip and ring contacts of the first connector to respective tip and ring contacts of the second connector.

9 Claims, 5 Drawing Sheets

CABLE TERMINATING CONNECTORS

BACKGROUND OF THE INVENTION

This invention relates to multiconductor cables used for transmitting electrical signals, and particularly to the attachment, during manufacture of the cables, of connectors at the ends of the cable for providing electrical connections to the cable conductors.

While the present invention has utility with various types of signal transmitting cables, it has particular use with cables comprising twisted pairs of wires used in the telecommunication industry. By "twisted pairs" it is meant that the two wires of each pair are wound around one another in a pair of intertwined spirals; the twisting together of the two wires being effective for noise suppression. Each pair of wires provides a separate communication channel and, for signal routing purposes, all the wires within the cable terminate at preselected ("dedicated") contacts (e.g., prongs of plug-type connectors) of the two end connectors. Thus, within each connector, all the wire pairs are in preselected sequence and, for each wire pair, the two wires (typically referred to in the telecommunications industry as "tip" and "ring" wires) are likewise in preselected orientation (the tip wire always being, for example, to the left of the ring wire with a given orientation of the connectors).

In the manufacture of such telecommunication cables, continuous cables are made, cut to desired lengths, and connectors are attached to each cable end. The latter process comprises removing the cable sheathing at the cable ends, identifying and sorting the wire pairs into a preselected pattern, untwisting end lengths of wires from each wire pair, and disposing the two wires of each pair in proper side-by-side relation. When the cables are of the "flat" ribbon type, comprising side-by-side pairs of wires in fixed relationship over the lengths of the cables, no sorting of the wire pairs is necessary. However, owing to the twisting of the wires of each pair around one another, it is not possible to know in advance, upon the cutting of the cables, the relative side-by-side positions of the wires of each pair. Thus, in all instances, it is necessary to selectively untwist the wires of each wire pair more or less as is necessary to dispose the two wires in proper side-by-side relationship.

The wires are color encoded, e.g., the ring wire is always of a darker color then the tip wire, and a human operator has little difficulty in identifying the wires of each wire pair and properly positioning them. It is desired, however, to automate the connector assembling process and a quite serious problem encountered is that of designing a machine to perform the wire pair selective untwisting and side-by-side sorting process. Indeed, while various aspects of cable manufacture are substantially completely automated, successful automation of the process of side-by-side sorting of the wires of each pair has not been achieved. Such process is greatly simplified in accordance with this invention.

SUMMARY OF THE INVENTION

In accordance with one aspect of the invention, the inventive manufacturing process begins with the first ends of a pair of color encoded, twisted wires already respectively connected (as hereinafter described) to two dedicated contacts of a first cable connector. Second ends of the two wires are then connected, on a random basis, to respective "intermediate" contacts of a second cable connector. Each intermediate contact is connected by separate conductive paths to both contacts of the second connector corresponding to the dedicated contacts of the first connector. Then, dependent on which wire is connected to which dedicated contact of the first connector, one conductive path from each intermediate contact in the second connector is broken such that the corresponding dedicated contacts of the two connectors are respectively interconnected by the two wires.

In a preferred embodiment, the first ends of the wire pair are also randomly connected to the dedicated contacts of the first connector. Thus, visual observation, based upon the color encoding of the wires, is first made to determine which wire is, in fact, connected to which dedicated contact of the first connector. In this embodiment, either wire of each wire pair, regardless of how the wire is color encoded, can function as a tip or ring wire. In an alternative, less preferred embodiment [by attorney], the first ends are connected, under human control, in preset side-by-side relation, whereby color detection only of the randomly made wire connections in the second connector is necessary.

As described, the second connector, in accordance with this invention, includes intermediate contacts each, at least initially, connected to two contacts of the second connector. The first connector, however, can comprise a known type connector including no intermediate contacts but merely typical externally accessible contacts. With such known first connectors, the cable wires are connected (randomly or not) directly and solely to respective contacts of the first connector. In an alternative embodiment, for reduction of parts inventory, the first connector is identical to the second connector and includes two intermediate contacts for each wire pair with both intermediate contacts being connected to both contacts dedicated to each wire pair. In this arrangement, the first ends of a wire pair are first respectively connected (preferably randomly) to a pair of intermediate contacts of the first connector. Then, for establishing a starting condition of the wire first ends being exclusively connected to respective dedicated contacts of the first connector, one conductive path from each intermediate contact is broken.

DESCRIPTION OF THE DRAWINGS

The figures of the drawing are schematic and not to scale.

FIGS. 2 and 3 are views, in perspective, of portions of one end connector of a cable according to the present invention, FIG. 2 showing a printed circuit board component of the connector; and FIG. 3 showing the same board but with hardware mounted, and to be mounted, thereon;

FIGS. 4 and 5 show an interconnecting pattern of one wire pair with both end connectors of a cable according to the present invention; FIG. 4 showing an intermediate fabrication step, and FIG. 5 showing a following step;

DETAILED DESCRIPTION OF PREFERRED EMBODIMENTS

Figure 1:
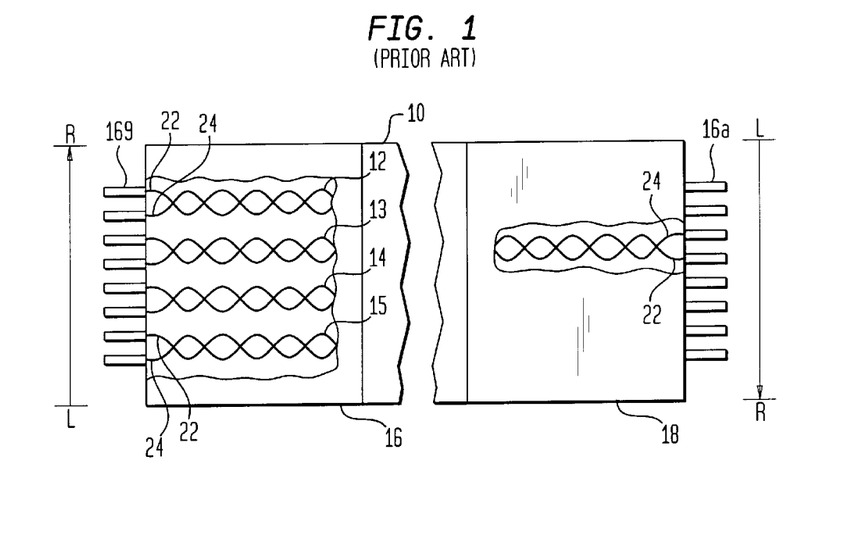
FIG. 1 is a view, partly broken away, of a known cable comprising a plurality of twisted wire pairs and male connectors at both ends of the cable.

FIG. 1 is a schematic illustration of a known type of cable 10 used in the telecommunication industry. The cable 10 includes, in this example, four twisted wire pairs 12, 13, 14, and 15, and end connectors 16 and 18 of the male type (plug-type externally accessible contacts 16a) at opposite ends of the cable, wherein all the wires of all the wire pairs are preselectedly connected to respective dedicated connector contacts. Thus, for each connector (which can be inserted in but one orientation into a mating socket), the left-to-right sequence of wire pairs is identical and each ring wire 22 of each wire pair is always, e.g., to the right of each tip wire 24. Cables made according to the invention can be identical in function to known cables but, in a preferred embodiment of the invention, the side by side orientation of the color encoded wires of each wire pair is randomly variable. This is further described hereinafter.

Figure 2:
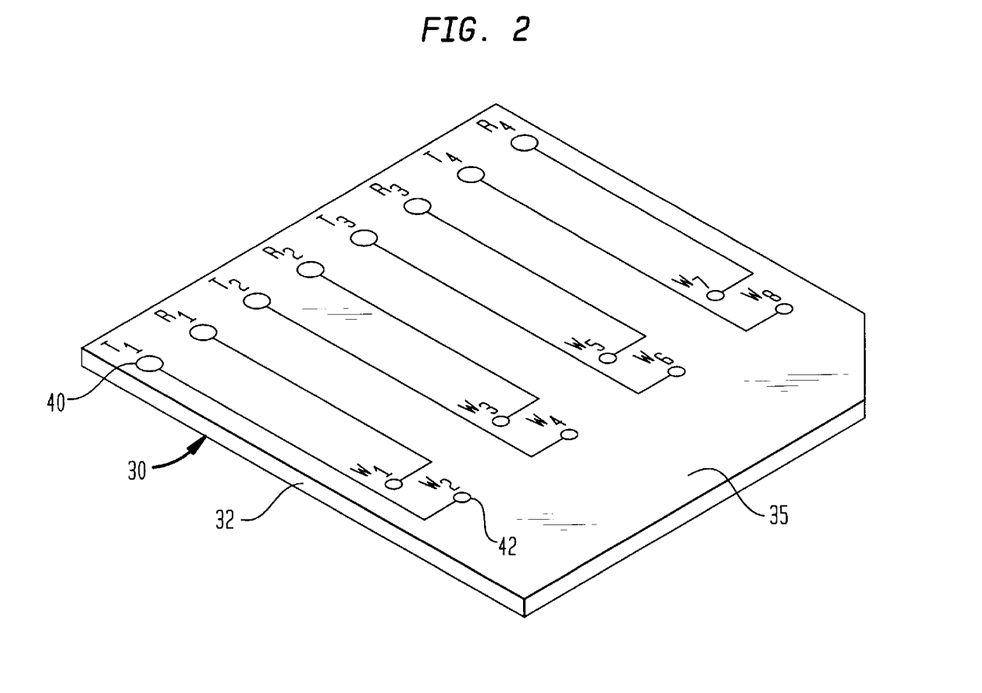
Figure 3:
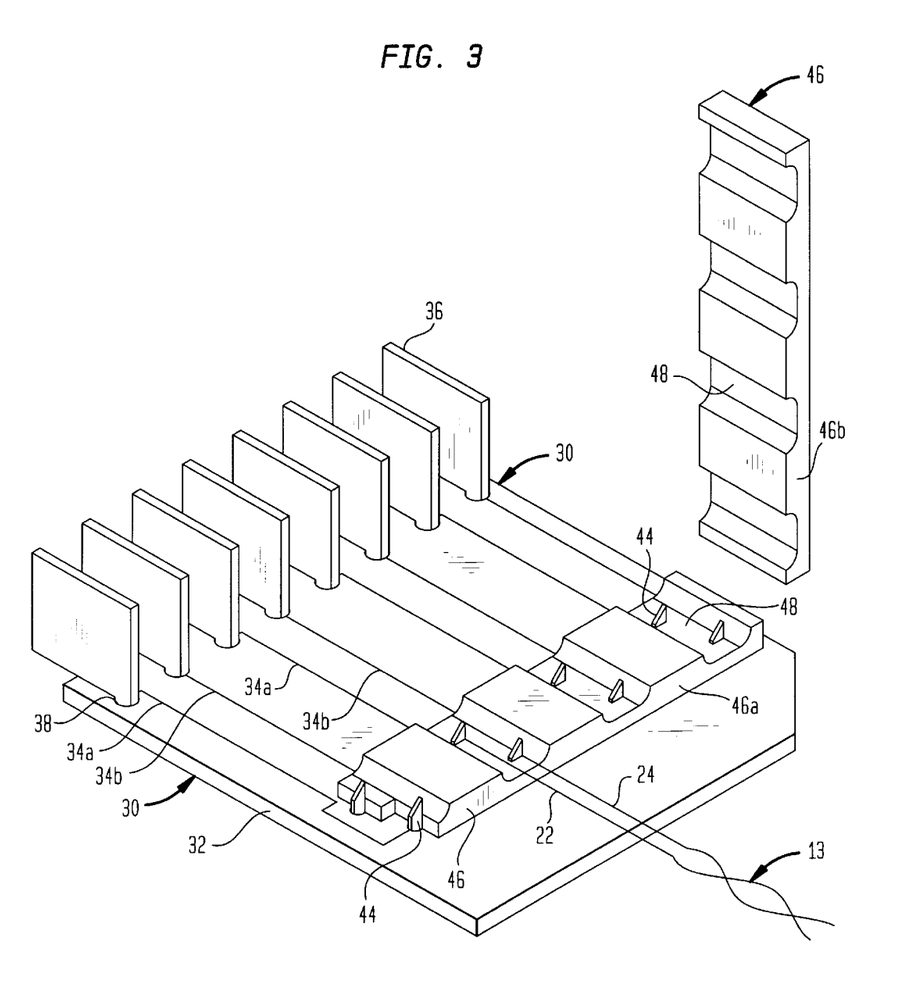

An example of a cable end connector 30 comprising, in accordance with this invention, a printed circuit board of known type is shown in FIGS. 2 and 3. FIG. 2 shows only the printed circuit board substrate 32, and FIG. 3 shows "hardware" mounted on the substrate 32. The substrate 32 is of insulating material, e.g., epoxy/fiberglass, having conductive paths 34 (a and b) on a surface 35 of the substrate. The conductive paths 34, e.g. of solder plated copper, are provided in known manner, e.g., by screen printing or by photolithographic etching of an originally continuous metal layer initially provided on the substrate 32. In this embodiment, the connector 30 is of the plug-type and comprises externally accessible contacts 36 (FIG. 3) in the form of flat metal plates or "blades". (By "externally accessible" is meant that, when the connector is connected to a mating connector, the externally accessible contacts make electrical contact with corresponding contacts in the mating connector.) Each contact blade 36 terminates in an extending pin 38 press-fit or soldered within an opening 40 (FIG. 2) through the substrate 32. The walls of the openings are metal plated by extensions of respective conductive paths 34 leading from each contact blade opening 40 to a respective metal plated opening 42. Each opening 42 contains (FIG. 3) a "pierce-type" contact 44 of known type, e.g., a sharpened pin for penetration through the insulation of a wire for making electrical contact with the wire. FIG. 3 additionally shows a known type of wire guide 46 used in combination with the pierce-type contacts 44. The wire guide 46 has halves 46a and 46b, each containing wire receiving channels 48. In assembly, the ends of a pair of wires 22 (ring) and 24 (tip) from each wire pair (only one being shown) are disposed side-by side in a channel 48 of a lower wire guide half 46a attached to the substrate 32 and overlapping respective contacts 44 extending upwardly into the channel 48. With all the wires of all the wire pairs in place, the upper wire guide half 46b is locked firmly in place on the lower half 46a for forcing the wires against the contacts 44 for penetration of the contacts into electrical connections with the wire conductors.

As mentioned, the use of pierce-type contacts for interconnecting wires to contacts of connectors is known and, to the extent so far described, the connector 30 shown in FIG. 3 is functionally identical to known type connectors used at the ends of known type cables. Thus, each wire of a plurality of wire pairs is directly connected to a respective externally accessible contact 36 of the connector with the wires of each wire pair being respectively connected to a pair of side-by-side contacts. Hereinafter, more will be said about the connector 30.

With all the wires of four twisted wire pairs in place on the ("first") connector 30 (FIG. 3 showing but one wire pair), the other ends of all the wires are then connected to another ("second") male type connector 50. This is illustrated in FIG. 4.

Figure 4:
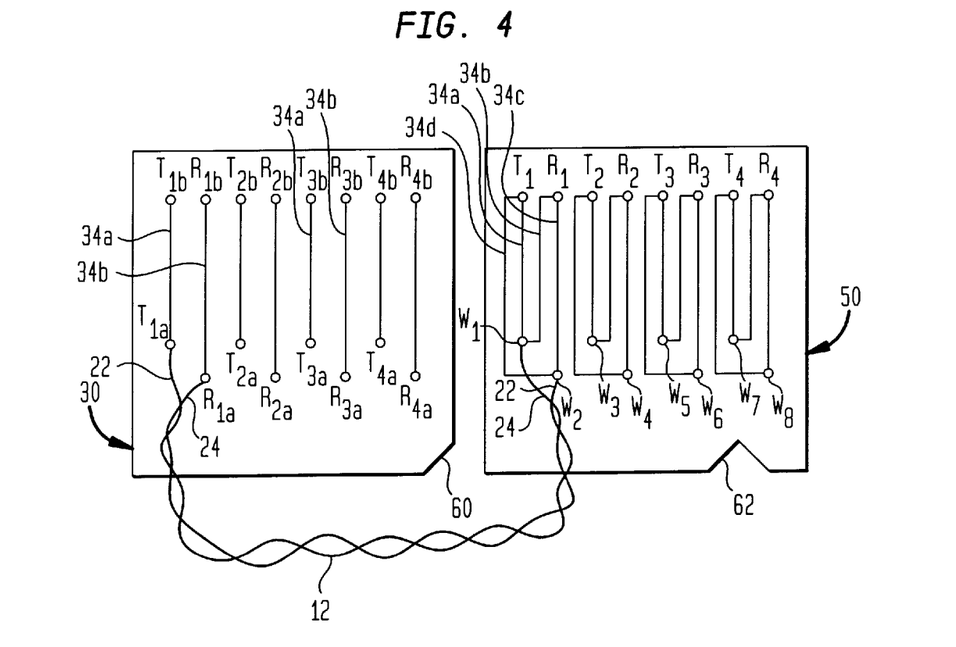

FIG. 4 is quite schematic and shows only those essentials needed for an understanding of the invention. The connector 30 (FIG. 3) is shown in FIG. 4 with but one wire pair connected thereto. The tip wire 22 of a wire pair 12 is connected to an "intermediate" or "inner" contact T1a (e.g., a pierce-type contact 44 shown in FIG. 3) at the end of a conductive path 34a extending into contact with an "external" contact T1 (e.g., an externally accessible contact blade 36 shown in FIG. 3). Likewise, the ring wire 24 is connected to an inner contact R1a of a conductive path 34b connected to an external contact R1b.

FIG. 4 also illustrates how the opposite ends of the tip 22 and ring 24 wires of the wire pair 12 are connected to respective external contacts T1 and R1 of the connector 50. Connector 50 is similar to connector 30 in that it includes conductive paths 34a and 34b connected to respective external contacts T1 and R1. Opposite ends of the conductive paths 34a and 34b are connected to respective internal contacts labeled W1 and W2. Physically, the internal contacts W1 and W2 are identical to the internal contacts T1a and R1a of the connector 30, e.g., comprising pierce type contacts 44 such as shown in FIG. 3. As previously indicated, the wires 22 and 24 are connected on a random basis to the connector 50 and, for purposes of illustration, the wires 22 and 24 are shown connected, respectively, to the contacts $W_2$ and $W_1$.

Connector 50 differs from connector 30, however, in that each internal contact W1 and W2 is electrically connected to both external contacts T1 and R1. Typically, such contacts are also of the blade type. (Blade type contacts are well known and various types of such contacts can b e used in the practice of this invention.) Internal contact W1 of connector 50, connected to external contact T1 by conductive path 34a, is also connected to external contact R1 by a conductive path 34c. Likewise, internal contact W2 is connected to both external contacts T1 and R1 by conductive paths 34d and 34b, respectively. The result of this connecting scheme is that, in the condition illustrated in FIG. 4, both wires 22 and 24 are connected to both external contacts T1 and R1 of the connector 50 and, indeed, the two wires are shorted to one another.

Obviously, a selective interconnecting arrangement must be established. However, because both wires 22 and 24 are connected to both external contacts $T_1$ and $R_1$ of the connector 50, either wire can be exclusively connected to either external contact by selective opening or breaking one of each pair of conductive paths from each internal contact $w_1$ and $w_2$. Accordingly, and in accordance with the present invention, after the two wires 22 and 24 have been connected, at random as previously noted, to the two internal contacts $W_1$ and $W_2$, then, and based upon which wire 22 and 24 is exclusively connected to which external contact $T_{1b}$ and $R_{1b}$ of the connector 30, appropriate ones of the conductive paths on the connector 50 are broken to replicate the wire connection pattern on the connector 30 on the connector 50.

Figure 5:
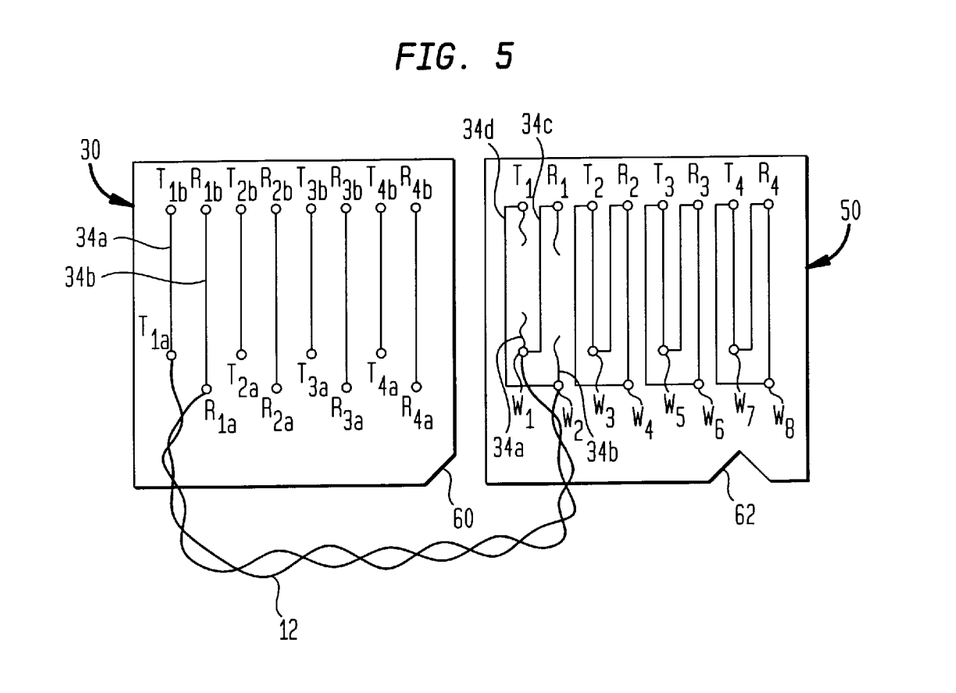

In the example illustrated in FIG. 4, the tip wire 22 is connected to the external tip contact $T_{1b}$ of the connector 30. The other end of the tip wire 22 is connected, in the example being illustrated, and on a random basis, to the internal contact $W_2$ of the connector 50. Accordingly, for connecting the internal contact $W_2$ solely to the external contact $T_1$ of the connector 50, the conductive path 34b is broken as illustrated in FIG. 5. Likewise, for connecting the ring wire 24, connected to the contact $W_1$ (FIG. 4) exclusively to the external contacts $R_{1b}$ of connector 30 and $R_1$ of connector 50, the conductive path 34a on the connector 50 is broken.

Breakage, or opening of printed circuit board conductive paths is known in, for example, the semiconductor industry, and can be accomplished efficiently and inexpensively by known laser beam apparatus.

An advantage provided by the present invention is as follows. In prior known technology, connectors "similar" to the connector 30 are used at both ends of each cable. By "similar" is meant that each wire of the cable is connected, during manufacture, directly and exclusively to a respective dedicated contact of each connector. To this end, the wires are color encoded and (as previously described) the two wires of each twisted wire pair are untwisted for disposing the color identified tip end ring wires in proper side-by-side relationship for connection to the dedicated connector contacts. Owing to the twisting of the wires, the only presently known practical manner for accomplishing the side-by-side sorting of the tip and ring wires is to observe the actual relationship that exists at the ends of the wires upon cutting each wire pair, and to then selectively untwist the wires to obtain the preselected relationship. This is time consuming and, heretofore, performed under direct human control.

In accordance with this invention, however, the process is simplified because, while the wires of each twisted pair must be separated for individual connections to the connector contacts, the separation process can be done without referral to the actual side-by-side disposition of the tip and ring wires. All that is required is that, without identifying each wire, the two wires are simply separated and terminated regardless of their actual side-by-side disposition.

As previously noted, a principal purpose of the present invention is to facilitate automation of the process of connecting connectors to the ends of cables. The described process, however, can be practiced by hand and, because an enabling disclosure is herein provided, no apparatus for performing the method is illustrated.

In the foregoing description of the embodiment of the invention illustrated in FIGS. 2–5, no description was provided concerning the selection of which wire of the wire pair 12 is connected to which internal contact $T_{1a}$ and $R_{1a}$ of the "first" connector 30.

In a preferred embodiment, the two wires 22 and 24 are randomly connected to the contacts $T_{1a}$ and $R_{1a}$ of the connector 30. The foregoing described process of then properly connecting the two wires 22 and 24 to the corresponding external contacts $T_1$ and $R_1$ of the "second" connector 50 remains unchanged because, as described, the selective opening of the pair of conductive paths on the connector 50 is based upon the actual connections of the wires 22 and 24 to the contacts $T_{1a}$ and $R_{1a}$ of the connector 30. This is determined by visual observation in reliance upon the color encoding of the wires. Thus, if the lighter colored "tip" wire 22 of the wire pair 12 is connected (on a random basis) to the tip contact $T_{1a}$ of the connector 30, as illustrated in FIG. 4, and the "tip" wire 22 is connected to the internal contact $W_2$ of the connector 50, the two conductive paths 34a and 34b are then, as previously described, broken, as shown in FIG. 5. Conversely, if the lighter colored "tip" wire 22 is connected (on a random basis) to the internal contact $W_1$ (FIG. 6) of the connector 50 (while "again" being connected to the tip contact $T_{1a}$ of the connector 30), the conductive paths 34c and 34d are broken.

The reason the words "tip" and "ring" are placed in quotes in the foregoing description is because, whereas, in the prior art practice, the color coding actually determines the tip and ring interconnecting function of each wire, in accordance with the present invention, either colored wire connects, on a random basis, a respective pair of tip or ring external contacts.

A disadvantage of the present invention is noted. In the prior art practice, because the tip wire is always placed on a preselected (e.g., left) side of the ring wire, there is no need for a human operator to observe the actual connection of the color encoded tip and ring wires to the first connector during connection of the wires to the second connector because it is already known. According to the inventive process, however, the actual connections of the color encoded wires to the contacts of the first connector must be determined for selection of the proper conductive paths on the second connector to be broken. If both ends of each pair of wires are randomly connected to the first and second connectors, four combinations of interconnections are possible. A human operator, of course, can readily determine, based upon observation of the connections actually present, which pair of conductive paths to break on the second connector. On a practical basis and, if done on a repetitive basis in a factory, the process would be so time consuming and require such concentration that the inventive process, if done by hand, is possibly less desirable than the prior art practice in a factory.

Conversely, if the determination of the actual wire connections present is done by machine, the determination can be made flawlessly and essentially instantaneously. For example, by focusing reflected light from each wire connected to the two connectors to respective light detectors (using for example, fiber optics and semiconductor light sensor arrays), the actual side-by-side determination of the lighter and darker colored wires of each pair of wires a t each connector can be readily determined. As mentioned, for each pair of wires, only four possibilities exist. Thus, in simple reliance upon a pre-established look-up table, the proper pair of conductive paths to be cut for each pair of wires is readily done. Both the logic and memory involved are simple and easily machine implemented. Accordingly, while the inventive process can be performed manually, as described, commercial use of the invention is preferably and advantageously performed on a fully automated basis.

Returning to the question of how the wires are connected to the first connector 30 (FIG. 4), one possibly, when the inventive process is performed under human control, is to connect the color encoded tip 22 and ring 24 wires always to preselected tip and ring contacts of the first connector. For example, as shown in FIG. 4, the darker ring wire 24 would always be connected on the connector 30 to the right of the lighter tip wire 22. Then, for determining which conductive paths 34 on the connector 50 to break, observation of the thus known connections of the wires 22 and 24 to the first connector 30 is not necessary. This reduces the amount of information to be determined by a human operator and improves the reliability of the process on a repetitive, factory basis. Conversely, when the process is performed by machine, the wires of each wire pair are preferably randomly connected to both connectors.

Figure 6:
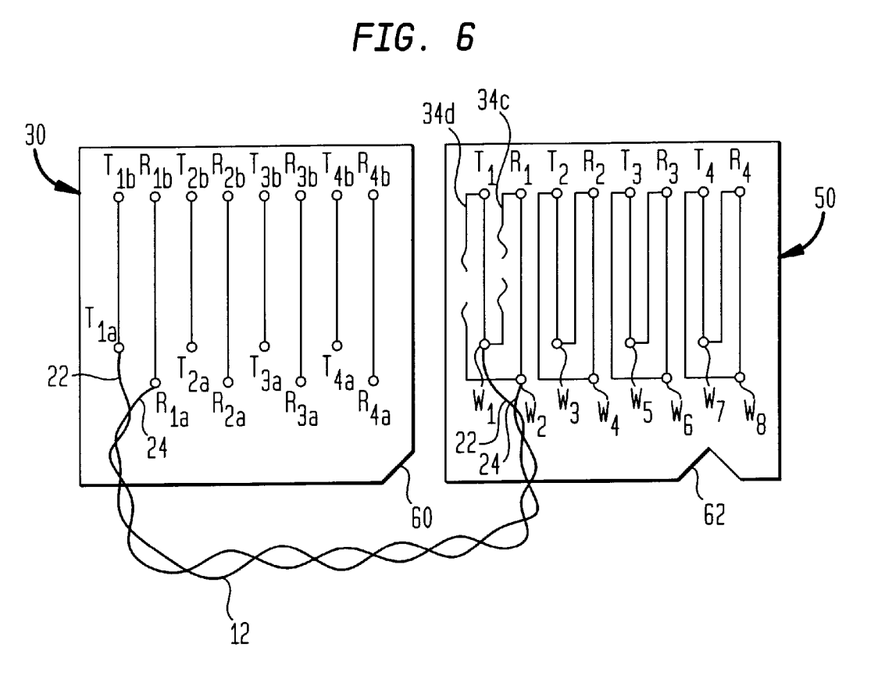
FIG. 6 is similar to FIG. 5 but showing a modification therefrom.

In the arrangement illustrated in FIGS. 4–6, two different connectors 30 and 50 are used. For identification purposes, particularly for use in an automated process, it is convenient to provide the two connectors with readily recognized indicia, e.g., a corner notch 60 for the connector 30 and a side notch 62 for the connector 50.

In some instances, e.g., for avoiding the necessity of inventorying two separate connectors 30 and 50 and properly distributing them to different work stations in a factory, it is desirable to use a common connector at both ends of the cable. The inventive process requires a "second" connector, such as connector 50, for connecting, at least initially, both wires of each wire pair to both external tip and ring contacts of the second connector dedicated to each wire pair. The inventive process also requires a unique connection scheme of each wire to respective tip and ring contacts of a "first" connector for establishing which pair of conductive paths on the "second" connector need to be broken. However, it is possible to satisfy both these requirements using the connector 50 as both connectors. This is illustrated in FIG. 7.

Figure 7:
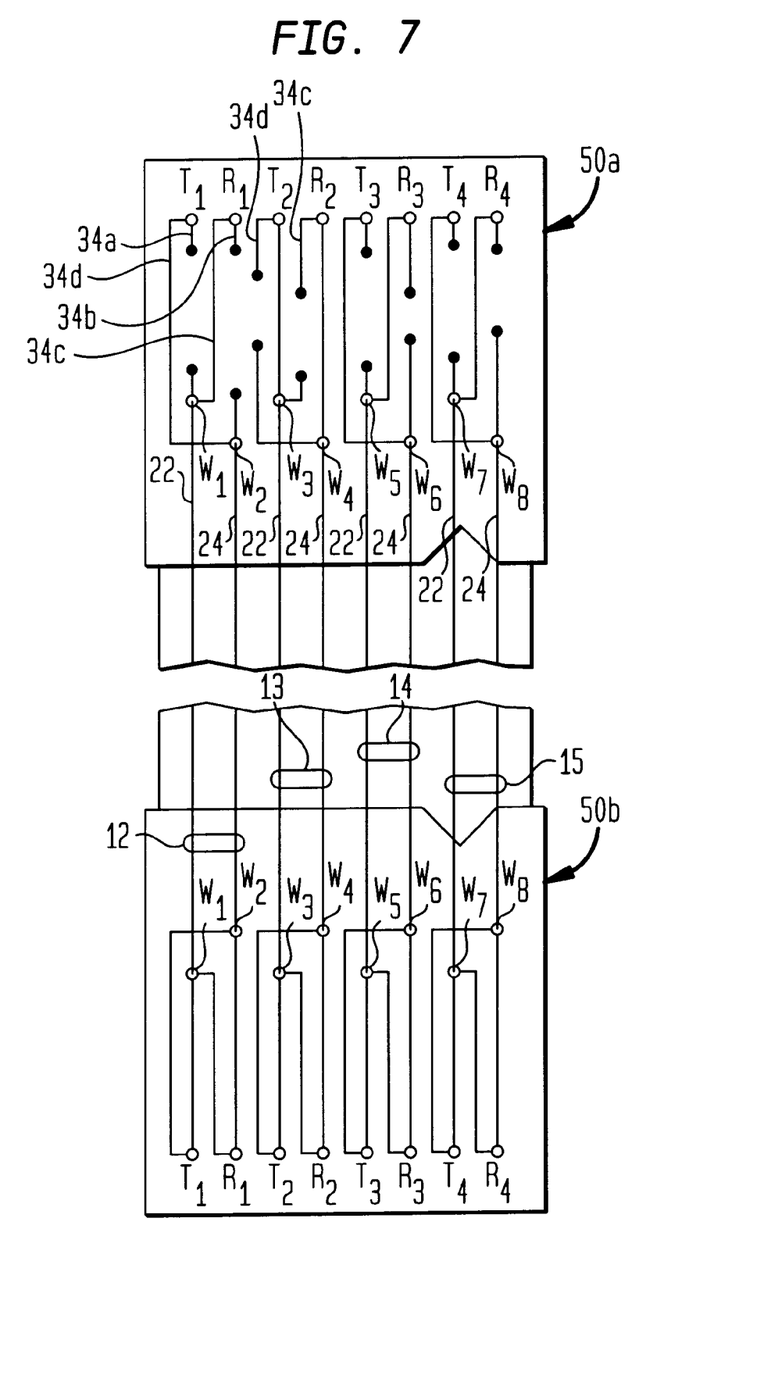
FIG. 7 shows one example of a wiring pattern in a cable made in accordance with this invention.

FIG. 7 shows two identical connectors, 50a and 50b, with the connector 50a being the "first" connector, i.e., the connector 50a having an interconnection pattern to be later replicated on the "second" connector 50b. In FIG. 7, while the side-to-side sequence of wire pairs 12–15 is identical on both connectors 50a and 50b, the two wires of each wire pair have been connected on a random basis to the internal contacts Wn of both connectors 50a and 50b.

FIG. 7 shows the process after one pair of conductive paths (either 34a and 34b or 34c and 34d) for each wire pair has been broken on the first connector 50a. Provided the path breaking process results in the internal contacts Wn for each wire pair being exclusively connected to respective tip or ring contacts, it is immaterial which pair of conductive paths is broken. To illustrate this latter point, in FIG. 7, different pairs of conductive paths are broken for each wire pair. Thus, for the first wire pair 12, the conductive paths 34a and 34b on the first connector 50a are broken. This results, on the connector 50a, in internal contact $W_1$ being connected to external contact $R_1$ and internal contact $W_2$ being connected to external contact $T_1$. Wire 22, connected (at random) to internal contact $W_1$ of the connector 50a, is thus exclusively connected to external contact $R_1$ of connector 50a, and wire 24 is similarly exclusively connected to external contact $T_1$.

For the second wire pair 13, however, in the illustrative example of FIG. 7, the conductive paths 34c and 34d on connector 50a are broken for exclusively connecting the internal contacts $W_3$ and $W_4$ to the external contacts $T_2$ and $R_2$, respectively.

In FIG. 7, different pairs (34a–34b and 34c–34d) of conductive paths for each wire pair are broken on a random basis. On a practical basis, in an automated process, there is no need for randomness and the conductive path pairs on the first connector 50a will typically be preselected and identically broken for all wire pairs.

With the condition established as shown in FIG. 7 for the connector 50a, the previously described inventive process is followed for replicating the wire interconnecting pattern present on the first conductor 50a on the second conductor 50b.

With the completion of the wire connection process (after selective breakage of the conductive paths 34), each end connector (30 and 50 or 50a and 50b), including all the wires connected thereto as well as a length of fully sheathed cable, must be completely encapsulated to provide a cable such as shown in FIG. 1. One arrangement is to completely glass encapsulate the connectors.

Figure 8:
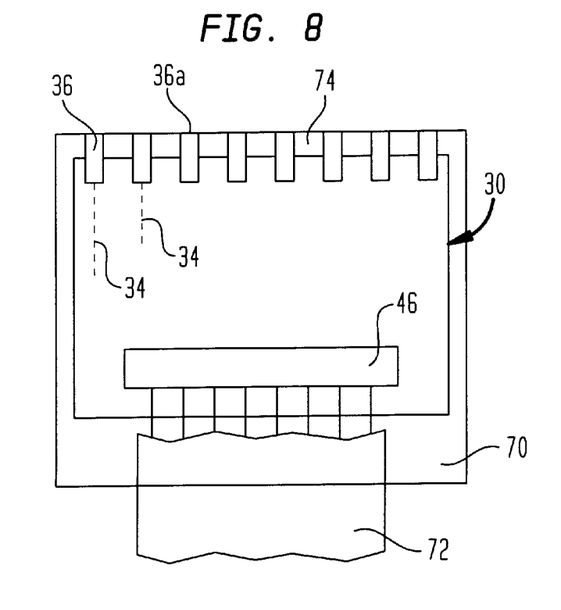
FIG. 8 is a plan view of one end of a cable according to the present invention including a glass encapsulated connector of the type shown in FIG. 3.

This is schematically illustrated in FIG. 8 which shows a connector 30, such as shown in FIG. 3, but with four wire pairs in place, the wire guide halves of the wire guide 46 clamped together about the wire pairs, and a rigid glass block 70 encapsulating the connector 30 as well as a length of sheathed cable 72 extending from the connector. The various blade contacts 36 are substantially fully encapsulated within the glass block 70 with the exception of a forwardly facing end surface 36a of each contact blade which is exposed substantially flush with an external surface 74 of the glass block.

As shown in FIGS. 4–8, the second connector 50 includes two conductive paths (34a,b or 34c,d) connected to each internal contact Wn. For ease of illustration and understanding, all the conductors are shown on a common surface of the substrate 32. For space conservation, a preferred arrangement is to dispose one conductive path (34a, 34d) from each internal contact W on one side of the substrate and the other conductive path (34b, 3c) associated with the contact W on an opposite side of the substrate. This is practical because the plated openings 40 and 42 (FIG. 2) in which the contact blades 36 and pin 44 are disposed extend entirely through the substrate and open onto both major surfaces thereof. While such double sided substrate is not illustrated herein, it can be readily visualized by assuming that the substrates 32 shown are of transparent glass, hence that the conductive paths on both sides of the substrates are simultaneously visible.

In conventional terminology, the term "contact" means an externally accessible contact of a connector. In the following claims, such usage is followed and neither the terms "external" nor "internal" is used. Rather, the "internal" contacts (e.g., the pins 44) are referred to, in the claims, as "intermediate" contacts.

The cable end connectors illustrated herein are of the male type including externally extending prongs. The invention can also be used with cables terminating in female type connectors, including receptacles for receipt of prong contacts, or of the hybrid type including male and female type connectors at opposite ends of the cable.

What is claimed is:

1. A cable comprising a pair of wires, first and second connectors at opposite ends of the cable, said first connector comprising preselected first and second contacts connected through respective said wires to respective preselected third and fourth contacts of said second connector, each of said wires being directly connected to a respective one of a pair of intermediate contacts of said second connector, each of said intermediate contacts being connected to respective pairs of conductive paths, one path from each of said pairs of conductive paths extending continuously from a respective said intermediate contact to a respective one of said third and fourth contacts, and the other path of each of said paths of conductive paths extending brokenly from a respective intermediate contact to a respective other of said third and fourth contacts.

2. A cable according to claim 1 wherein said second connector includes a printed circuit board on which are mounted, in spaced apart relation, said third and fourth contacts and said pair of intermediate contacts, said conductive paths comprise elongated strips of metal on a surface of said board, each of said strips being connected to and extending between a respective said intermediate contact and respective said third and fourth contacts, one of said strips of each of said pair of conductive paths being open connected.

3. A cable according to claim 1 and being one of a plurality of functionally identical cables, each cable including a plurality of twisted pairs of wires, said wires being color coded for visually distinguishing the wires of each pair of wires from one another, said wires being disposed within said first & second connectors in side-by-side relationship with the side-by-side sequence of wire pairs being identical in all said first & second connectors of all said cables, and the side-by-side sequence of the color encoded wires of each said wire pair in the second connector of all said cables being randomly connected from cable to cable.

4. A plurality of cables according to claim 3 wherein the first and second connectors of all the cables are structurally identical except for the side-by-side dispositions of the color encoded wires of each said pair of twisted wires, said side-by-side dispositions being randomly selected.

5. A method of connecting a pair of connectors to opposite ends of a pair of wires such that preselected first and second contacts of a first of said connectors are respectively connected to preselected third and fourth contacts of a second of said connectors, the method comprising the steps of connecting first ends of said wires to respective said first and second contacts of said first connector, connecting said opposite ends of said wires, at random, to respective first and second intermediate contacts of said second connector each of which is connected by a pair of conductive paths to respective said third and fourth contacts of said second connector, determining which of said wires connected to said respective first and second contacts of said first connector are connected to which of said first and second intermediate contacts, and, based upon the connection determined in said determining step, breaking one path of each pair of said conductive paths for leaving said first and second contacts of said first connector exclusively connected to respective said third and fourth contacts of said second connector.

6. A method according to claim 5 wherein said wires are optically encoded, and said determining step comprises optically identifying the wires connected to said intermediate contacts.

7. A method according to claim 6 wherein said optically encoded wires are connected to said respective first and second contacts of first connector in accordance with a preselected connecting scheme whereby said determining step comprises identifying only the wires connected to said intermediate first and second contacts of said second connector, and said breaking step is based upon said determined step and said preselected connecting scheme.

8. A method according to claim 6 wherein the step of connecting said wires to said respective first & second contacts of said first connector is performed randomly, and said determining step includes optically identifying the wires connected to said first and second contacts.

9. A method according to claim 8 wherein the step of connecting said wires to said respective first and second contacts of said first connector includes the step of randomly connecting said wires to said respective third and fourth contacts of said second connector each of which is connected by said pair of conductive paths to respective said first and second intermediate contacts, and, prior to said determining step, breaking one path of each said pair of paths for leaving said wires exclusively connected to said respective first and second contacts of said first connector.

* * * * *